United States Patent
Watanabe (10) Patent No.: US 10,290,771 B2
(45) Date of Patent: May 14, 2019

(54) GROUP III NITRIDE SEMICONDUCTOR LIGHT EMITTING DEVICE AND METHOD FOR MANUFACTURE THE SAME

(71) Applicant: DOWA Electronics Materials Co., Ltd., Chiyoda-ku, Tokyo (JP)

(72) Inventor: Yasuhiro Watanabe, Akita (JP)

(73) Assignee: DOWA Electronics Materials Co., Ltd., Chiyoda-ku, Tokyo (JP)

(*) Notice: Subject to any disclaimer, the term of this patent is extended or adjusted under 35 U.S.C. 154(b) by 167 days.

(21) Appl. No.: 15/488,778

(22) Filed: Apr. 17, 2017

(65) Prior Publication Data

US 2017/0309785 A1   Oct. 26, 2017

(30) Foreign Application Priority Data

Apr. 20, 2016  (JP) ................ 2016-084478
Nov. 30, 2016  (JP) ................ 2016-233420
Apr. 13, 2017  (JP) ................ 2017-079508

(51) Int. Cl.
    *H01L 33/32*   (2010.01)
    *H01L 33/00*   (2010.01)
    *H01L 33/02*   (2010.01)

(52) U.S. Cl.
    CPC .......... *H01L 33/325* (2013.01); *H01L 33/007* (2013.01); *H01L 33/0025* (2013.01); *H01L 33/0075* (2013.01); *H01L 33/02* (2013.01)

(58) Field of Classification Search
    CPC ............... H01L 33/325; H01L 33/0075; H01L 33/0025

See application file for complete search history.

(56) References Cited

U.S. PATENT DOCUMENTS

| | | | | |
|---|---|---|---|---|
| 9,647,168 | B2* | 5/2017 | Jain | H01L 33/04 |
| 2011/0266553 | A1* | 11/2011 | Ohta | H01L 33/02 |
| | | | | 257/76 |
| 2014/0014997 | A1* | 1/2014 | Kato | H01L 33/32 |
| | | | | 257/98 |
| 2017/0069793 | A1* | 3/2017 | Saito | H01L 33/32 |
| 2017/0338378 | A1* | 11/2017 | Fujita | H01L 33/145 |

FOREIGN PATENT DOCUMENTS

| | | |
|---|---|---|
| JP | 2009152491 A | 7/2009 |
| JP | 2010161311 A | 7/2010 |

* cited by examiner

*Primary Examiner* — Cory W Eskridge
(74) *Attorney, Agent, or Firm* — Kenja IP Law PC

(57) ABSTRACT

Provided is a III nitride semiconductor light emitting device with improved reliability capable of maintaining light output power reliably as compared with conventional devices, and a method of producing the same. The III-nitride semiconductor light-emitting device comprising: a light emitting layer, a p-type electron blocking layer, a p-type contact layer, and a p-side electrode in this order. The p-type contact layer has a first p-type contact layer co-doped with Mg and Si in contact with the p-type electron blocking layer and a second p-type contact layer doped with Mg in contact with the p-side electrode.

16 Claims, 4 Drawing Sheets

GROUP III NITRIDE SEMICONDUCTOR LIGHT EMITTING DEVICE AND METHOD FOR MANUFACTURE THE SAME

CROSS-REFERENCE TO RELATED APPLICATIONS

The present application claims priority to Japanese Patent Application No. 2016-084478 (filed on Apr. 20, 2016), Japanese Patent Application No. 2016-233420 (filed on Nov. 30, 2016), and Japanese Patent Application No. 2017-079508 (filed on Apr. 13, 2017). The contents of these applications are incorporated herein by reference in their entirety.

TECHNICAL FIELD

The present invention relates to a III-nitride semiconductor light-emitting device and a method of producing the same. The present invention relates in particular to a III-nitride semiconductor light-emitting device with improved reliability capable of maintaining high light output power, and a method of producing the same.

BACKGROUND

Conventionally, a III-nitride semiconductors made of compounds in which N is combined with Al, Ga, In, etc. are used as materials for ultraviolet light-emitting devices. In particular, III-nitride semiconductors made of high-Al-composition AlGaN are used for ultraviolet light-emitting devices or deep ultraviolet light-emitting devices (DUV-LEDs) emitting light at a wavelength of 300 nm or less.

Examples of the characteristics required of III-nitride semiconductor light-emitting devices include, but not limited to, high external quantum efficiency properties and low resistance properties. The applicant of the present application has previously proposed in JP 2010-161311 A (PTL 1) that the light emission efficiency can be improved by forming a layer serving as an energy barrier for electrons, which is called an electron blocking layer, between a light emitting layer having a quantum well structure and a p-type cladding layer. The electron blocking layer serves as a barrier against a quantum well layer of the light emitting layer and prevents electrons from flowing excessively, thereby improving carrier injection efficiency.

JP 2009-152491 A (PTL 2) discloses a nitride semiconductor device in which a mixed doped GaN layer with a film thickness of 25 nm or less, obtained through co-doping with a p-type impurity and an n-type impurity to a p-type impurity concentration of $1\times10^{19}$ atoms/cm$^3$ or more and an n-type impurity concentration of $1\times10^{19}$ atoms/cm$^3$ or more, is provided on a p-type GaN layer, and an electrode is formed on the mixed doped GaN layer. According to PTL 2, the mixed doped GaN layer reduces contact resistance between the p-type GaN layer and the electrode, which allows a current to easily flow into the p-type GaN layer.

CITATION LIST

Patent Literature

PTL 1: JP 2010-161311 A
PTL 2: JP 2009-152491 A

SUMMARY

The techniques described in PTL 1 and PTL 2 can improve the external quantum efficiency properties and the resistance properties of III-nitride semiconductor light-emitting devices. However, although the external quantum efficiency properties and the resistance properties of III-nitride semiconductor light-emitting devices have been improved, there remain challenges. Maintaining high the light output power of a III-nitride semiconductor light-emitting device is difficult, but it leads to improved reliability of the device; thus, there is a need for improvement in the reliability of the device in this regard.

In view of the above, it could be helpful to provide a III-nitride semiconductor light-emitting device with improved reliability capable of maintaining light output power reliably as compared with conventional devices, and a method of producing the III-nitride semiconductor light-emitting device.

The inventor diligently studied ways to address the above challenges and focused on dopants for a p-type contact layer of a III-nitride semiconductor light-emitting device. Here, Mg is typically used as a p-type dopant for doping the p-type semiconductor layer side of a III-nitride semiconductor light-emitting device; however, the inventor speculated that Mg having been introduced by doping into the p-type semiconductor layer side could diffuse into a light emitting layer to affect the reliability of the III-nitride semiconductor light-emitting device. Accordingly, it was envisaged that a certain region of a p-type contact layer was co-doped with Si in addition to Mg as a p-type dopant. Thus, the inventor found that the above-described p-type contact layer can improve the reliability the III-nitride semiconductor light-emitting device. This discovery led to the present invention.

Specifically, we propose the following features.

(1) A III-nitride semiconductor light-emitting device comprising: a light emitting layer, a p-type electron blocking layer, a p-type contact layer, and a p-side electrode in this order, wherein the p-type electron blocking layer is made of a p-type III-nitride semiconductor having an Al composition of 0.5 or more, the p-type contact layer is made of a p-type III-nitride semiconductor having an Al composition of less than 0.4, the p-type contact layer has a first p-type contact layer co-doped with Mg and Si in contact with the p-type electron blocking layer, and has a second p-type contact layer doped with Mg in contact with the p-side electrode, and the first p-type contact layer has a Mg concentration of $1\times10^{19}$ atoms/cm$^3$ or more, and a Si concentration of $2\times10^{18}$ atoms/cm$^3$ or more and $3\times10^{19}$ atoms/cm$^3$ or less.

(2) The III-nitride semiconductor light-emitting device according to (1) above, wherein a thickness of the first p-type contact layer is 1 nm or more and 30 nm or less, and a thickness of the second p-type contact layer is 30 nm or more.

(3) The III-nitride semiconductor light-emitting device according to (2) above, wherein a thickness of the first p-type contact layer is 5 nm or more and 15 nm or less.

(4) The III-nitride semiconductor light-emitting device according to any one of (1) to (3) above, wherein in the first p-type contact layer, the Mg concentration is higher than the Si concentration.

(5) The III-nitride semiconductor light-emitting device according to any one of (1) to (4) above, wherein a center wavelength of light emitted from the light emitting layer is 210 nm or more and 340 nm or less.

(6) A method of producing a III-nitride semiconductor light-emitting device, comprising:
a light emitting layer formation step of forming a light emitting layer;

a p-type electron blocking layer formation step of forming a p-type electron blocking layer on the light emitting layer;

a p-type contact layer formation step of forming a p-type contact layer on the p-type electron blocking layer; and a p-side electrode formation step of forming a p-side electrode directly on the p-type contact layer, wherein the p-type electron blocking layer is made of a p-type III-nitride semiconductor having an Al composition of 0.5 or more, the p-type contact layer is made of a p-type III-nitride semiconductor having an Al composition of less than 0.4, the p-type contact layer formation step includes a first p-type contact layer formation step of forming a first p-type contact layer co-doped with Mg and Si directly on the p-type electron blocking layer, and a second p-type contact layer formation step of forming a second p-type contact layer doped with Mg on the first p-type contact layer, and in the first p-type contact layer formation step, the first p-type contact layer has a Mg concentration of $1 \times 10^{19}$ atoms/cm$^3$ or more and a Si concentration of $2 \times 10^{18}$ atoms/cm$^3$ or more and $3 \times 10^{19}$ atoms/cm$^3$ or less.

(7) The method of producing a III-nitride semiconductor light-emitting device, according to (6) above, wherein in the first p-type contact layer formation step, a thickness of the first p-type contact layer is 1 nm or more and 30 nm or less, and in the second p-type contact layer formation step, a thickness of the second p-type contact layer is 30 nm or more.

(8) The method of producing a III-nitride semiconductor light-emitting device, according to (7) above, wherein a thickness of the first p-type contact layer is 5 nm or more and 15 nm or less.

(9) The method of producing a III-nitride semiconductor light-emitting device, according to any one of (6) to (8) above, wherein in the first p-type contact layer formation step, the Mg concentration is higher than the Si concentration.

(10) The method of producing a III-nitride semiconductor light-emitting device, according any one of (6) to (9) above, wherein in the p-type electron blocking layer formation step, a carrier gas containing hydrogen as a main component is supplied, and in the first p-type contact layer formation step, a carrier gas containing nitrogen as a main component is supplied.

(11) The method of producing a III-nitride semiconductor light-emitting device, according to any one of (6) to (10) above, wherein in the second p-type contact layer formation step, a carrier gas containing nitrogen as a main component is supplied first, and the supply is then switched from the carrier gas containing nitrogen as a main component to a carrier gas containing hydrogen as a main component.

(12) The method of producing a III-nitride semiconductor light-emitting device, according to any one of (6) to (11) above, wherein a center wavelength of light emitted from the light emitting layer is 210 nm or more and 340 nm or less.

Advantageous Effect

We provide a III-nitride semiconductor light-emitting device with improved reliability capable of maintaining light output power reliably as compared with conventional devices, and a method of producing the III-nitride semiconductor light-emitting device.

BRIEF DESCRIPTION OF THE DRAWINGS

In the accompanying drawings.

DETAILED DESCRIPTION

Prior to describing embodiments, the following points are described beforehand. Here, the term "AlGaN" alone for which the Al composition is not specified means a given compound having a chemical composition ratio of group III elements (Al and Ga in total) with respect to N of 1:1 and any given ratio between the group III elements of Al and Ga. In this case, even if no reference is made to In that is a group III element, In may be contained at 5% or less with respect to the III elements of Al and Ga. Further, the simple term "AlGaN" does not exclude AlN and GaN. Note that the value of the Al composition ratio can be measured for example by a photoluminescence measurement or an X-ray diffraction measurement.

In this specification, a layer serving as an electrically p-type layer is referred to as a p-type layer, and a layer serving as an electrically n-type layer is referred to as an n-type layer. Meanwhile, a layer that is not intentionally doped with certain impurities such as Mg and Si and does not serve as an electrically p-type or n-type layer is referred to as an "i-type" or "undoped" layer. An undoped layer may contain impurities that are inevitably mixed in the production process. Specifically, when the carrier density is low (for example, less than $4 \times 10^{16}$ atoms/cm$^3$), the layer is regarded as being "undoped" in this specification. Further, the values of the impurity concentrations of Mg, Si, etc. are determined by SIMS analysis.

The total thickness of the epitaxially grown layers can be measured using an interference thickness measurement system. Further, when the composition ratios of the adjacent layers are sufficiently different (for example, the Al composition differs by 0.01 or more), the thickness of each layer can be calculated by observing the cross sections of the grown layers using a transmission electron microscope (TEM). A first p-type contact layer and a second p-type contact layer to be described can be given as examples of two adjacent layers in the adjacent layers that have the same or substantially the same Al compositions (for example, the difference is less than 0.01) but have different impurity concentrations. The boundary and the thickness of such two adjacent layers can be specifically explained using the examples of the contact layers. The boundary between the first p-type contact layer and the second p-type contact layer and the thickness of the contact layers can be determined based on TEM-EDS. The impurity concentration of the contact layers can be measured by SIMS analysis. The thickness of each layer of a superlattice structure is thin, and the thickness can be measured using TEM-EDS.

Embodiments will now be described with reference to the drawings. In principle, like components are denoted by the same reference numerals, and the description of those components will not be repeated. A substrate and layers in each diagram are exaggerated for the sake of explanation, so that the aspect ratio does not conform to the actual ratio.

(First Embodiment: III-nitride Semiconductor Light-emitting Device)

Figure 1:
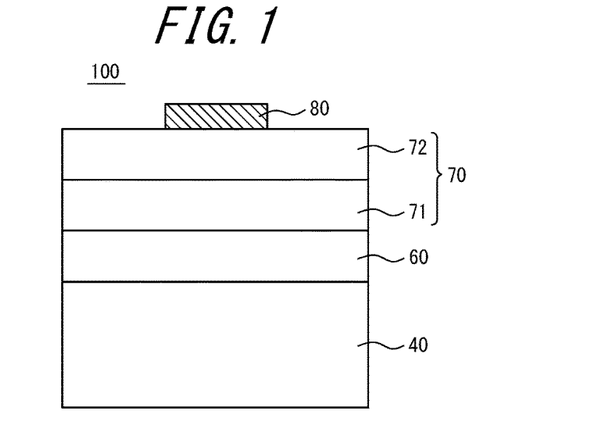
FIG. 1 is a schematic cross-sectional view illustrating a III-nitride semiconductor light-emitting device 100 according to one of the disclosed embodiments.

As illustrated in FIG. 1, a III-nitride semiconductor light-emitting device 100 according to the first embodiment includes a light emitting layer 40, a p-type electron blocking layer 60, a p-type contact layer 70, and a p-side electrode 80 in this order. The p-type electron blocking layer 60 is made of a p-type III-nitride semiconductor having an Al composition of 0.5 or more. The p-type contact layer 70 is made of a p-type III-nitride semiconductor having an Al composition of less than 0.4. Here, the p-type contact layer 70 has a first p-type contact layer 71 co-doped with Mg and Si in contact with the p-type electron blocking layer 60 and has a second p-type contact layer 72 doped with Mg in contact with the p-side electrode 80. The Mg concentration of the first p-type contact layer 71 is $1 \times 10^{19}$ atoms/cm$^3$ or more, and the Si concentration thereof is $2 \times 10^{18}$ atoms/cm$^3$ or more and $3 \times 10^{19}$ atoms/cm$^3$ or less. The structures will be described below in detail with reference to FIG. 1.

The light emitting layer 40 in the III-nitride semiconductor light-emitting device 100 can be formed from AlGaN, for example from $Al_aGa_{1-a}N$ (0<a≤1). Here, the Al composition a can be suitably set so that light of a desired wavelength is emitted. For example, when the Al composition a is 0.35 or more (i.e., 0.35≤a≤1), the center wavelength of light emitted from the light emitting layer 40 is 300 nm or less, and the III-nitride semiconductor light-emitting device 100 can serve as a DUV-LED. Thus, appropriately selecting the Al composition a or the Al composition w of a well layers 41 and the Al composition b of a barrier layers 42 to be described allows the center wavelength of light emitted from the light emitting layer 40 in the III-nitride semiconductor light-emitting device 100 to be 210 nm or more and 340 nm or less.

Here, the light emitting layer 40 is preferably configured to have a multiple quantum well (multiple quantum well: MQW) structure in which well layers 41 and barrier layers 42 made of AlGaN having different Al compositions are repeatedly formed. The Al composition of the well layers 41 can be, for example, 0.3 to 0.8. In this case, the Al composition b of the barrier layers 42 is higher than the Al composition w of the well layers 41 (i.e., b>w). For example, provided that b>w, the Al composition b of the barrier layers 42 can be 0.40 to 0.95. Further, the number of repetitions of the well layers 41 and the barrier layers 42 is not limited in particular, and can be for example once to ten times. The layers on both ends of the light emitting layer 40 in the thickness direction (i.e., the top and bottom layers) are preferably barrier layers. Accordingly, when the number of repetitions of the well layers 41 and the barrier layers 42 is n, those layers are referred to as "n.5 pairs of well layers and barrier layers". The thickness of the well layers 41 can be 0.5 nm to 5 nm, and the thickness of the barrier layers 42 can be 3 nm to 30 nm.

The p-type electron blocking layer 60 is provided on the light emitting layer 40 and is made of a p-type III-nitride semiconductor having an Al composition x of 0.5 or more, and can be formed from $Al_xGa_{1-x}N$ (0.5≤x≤1.0). The p-type electron blocking layer 60 is used as a layer for stopping electrons and injecting the electrons into the light emitting layer 40 (the well layer 41 in the case of a MQW structure) thereby improving the electron injection efficiency. To this end, the Al composition x preferably satisfies 0.5≤x≤0.95. Note that when the Al composition x is 0.5 or more, the p-type electron blocking layer 60 may contain up to 5% In with respect to the amount of the group III elements of Al and Ga. Here, when the light emitting layer 40 has the above-described multiple quantum well structure having the barrier layers 42, while the Al composition x should satisfy the above conditions, and it should be higher than the Al composition b of the barrier layers 42 and the Al compositions z1, z2 (as mentioned below) of the p-type contact layer 70. That is, x>b; meanwhile, x>z1 and x>z2. Here, the Al composition x of the p-type electron blocking layer 60 and the Al composition b of the barrier layers 42 preferably satisfy 0<x−b≤0.55, more preferably 0.1≤x−b≤0.55. Thus, the p-type electron blocking layer 60 can reliably increase the injection efficiency of electrons into the well layers 41. Note that the p-type electron blocking layer 60 preferably has a single layer structure with a fixed AlGaN composition.

The thickness of the p-type electron blocking layer 60 is preferably, but not limited to, for example, 10 nm to 80 nm. The thickness of the p-type electron blocking layer 60 falling within this range ensures that high light output power can be achieved. Further, the thickness of the p-type electron blocking layer 60 is preferably larger than the thickness of the barrier layers 42. Examples of p-type dopants used for doping of the p-type electron blocking layer 60 include Mg, Zn, Ca, Be, and Mn; Mg is typically used. The dopant concentration of the p-type electron blocking layer 60 is not limited in particular as long as the layer can serve as a p-type layer (having p-type conductivity), and can be for example $1.0 \times 10^{18}$ atoms/cm$^3$ to $5.0 \times 10^{21}$ atoms/cm$^3$. Further, as long as the p-type electron blocking layer 60 serve as a p-type layer, the p-type electron blocking layer 60 may have an undoped region in part in the thickness direction, and may be doped with Si in part in the thickness direction.

As described above, the p-type electron blocking layer 60 is used as a layer for stopping electrons and injecting the electrons into the light emitting layer 40 thereby improving the electron injection efficiency. To this end, in conventional techniques, the p-type electron blocking layer 60 is typically provided between a light emitting layer and a p-type cladding layer. When the light emitting layer 40 has a high Al composition, the hole concentration of a semiconductor layer provided on the p side (hereinafter, "p-side semiconductor layer") is low, which makes it difficult for holes to be injected into the light emitting layer 40, and would allow part of the electrons to flow toward the p-side semiconductor layer. However, the provision of the p-type electron blocking layer 60 can prevent such electron flows. In this embodiment, however, the p-type cladding layer is not provided and the p-type contact layer 70 is provided directly on the p-type electron blocking layer 60. This is because change in the carrier injection efficiency can be reduced by minimizing the structure between the p-type electron blocking layer 60 and the p-type contact layer 70 by eliminating the p-type cladding layer.

Note that in this specification, the Al composition y of the above-described "p-type cladding layer" is more than 0.1 lower than the Al composition x of the electron blocking layer 60 and is more than 0.1 higher than the Al compositions z1 and z2 (as mentioned below) of the p-type contact layers. That is, z1+0.1<y<x−0.1; meanwhile, z2+0.1<y<x−0.1. A higher Al composition of p-type AlGaN used for a center wavelength of 300 nm or less makes it more difficult for a current to flow; therefore, the Al composition of a conventional cladding layer is often equal to or less than the Al composition of barrier layers. For this reason, the electron blocking layer in this specification and a cladding layer of conventional techniques are distinguished based on the Al composition b of the barrier layers.

Next, the p-type contact layer 70 is provided on the p-type electron blocking layer 60. The p-type contact layer 70 is a layer for reducing contact resistance between the p-side electrode 80 provided on the p-type contact layer 70 and the p-type electron blocking layer 60, and the p-type contact layer 70 has the first p-type contact layer 71 in contact with the p-type electron blocking layer 60 and the second p-type contact layer 72 in contact with the p-side electrode 80. Providing the p-type contact layer 70 in contact with the p-type electron blocking layer 60 herein means that a III-nitride semiconductor layer having an Al composition y which may correspond to the above-mentioned p-type cladding layer does not reside between the p-type electron blocking layer 60 and the p-type contact layer 70.

Here, the p-type contact layer 70 is made of a p-type III-nitride semiconductor having an Al composition of less than 0.4. In other words, the first p-type contact layer 71 and the second p-type contact layer 72 are each formed from a p-type III-nitride semiconductor having an Al composition of less than 0.4. The first p-type contact layer 71 and the second p-type contact layer 72 are distinguished by the difference of dopants to be described. When the Al compositions of the first p-type contact layer 71 and the second p-type contact layer 72 are $z1$ and $z2$, respectively, the first p-type contact layer 71 can be formed from $Al_{z1}Ga_{1-z1}N$ ($0 \leq z1 < 0.4$), and the second p-type contact layer 72 can be formed form $Al_{z2}Ga_{1-z2}N$ ($0 \leq z2 < 0.4$). In particular, the Al compositions $z1$ and $z2$ preferably satisfy $0 \leq z1 \leq 0.1$ and $0 \leq z2 \leq 0.1$, respectively. The high-low relationship between $z1$ and $z2$ is not limited; however, most preferably, there is no Al composition difference between the first p-type contact layer 71 and the second p-type contact layer 72 ($z1=z2$, i.e., the Al composition difference is 0). When there is an Al composition difference, preferably $z1 \geq z2$, and more preferably the difference is 0.1 or less, still more preferably less than 0.05. In particular, $z1=z2=0$ (i.e., both the first p-type contact layer 71 and the second p-type contact layer 72 are made of GaN) is preferred. This can sufficiently reduce the contact resistance between the p-type contact layer 70 and the p-type electrode 80 thereon. The Al compositions $z1$ and $z2$ preferably satisfy, with respect to the Al composition x of the p-type electron blocking layer 60, $0.1 \leq x-z_1 \leq 0.95$ and $0.1 \leq x-z_2 \leq 0.95$, and more preferably satisfy $0.5 \leq x-z_1 \leq 0.95$ and $0.5 \leq x-z_2 \leq 0.95$. Note that when the Al compositions $z1$ and $z2$ are less than 0.4, the p-type electron blocking layer 60 may contain up to 5% In with respect to the amount of the group III elements of Al and Ga.

Here, the first p-type contact layer 71 is co-doped with Mg and Si, and the second p-type contact layer 72 is doped with Mg. In this embodiment, the Mg concentration of the first p-type contact layer 71 is $1 \times 10^{19}$ atoms/cm$^3$ or more, and the Si concentration thereof is $2 \times 10^{18}$ atoms/cm$^3$ or more and $3 \times 10^{19}$ atoms/cm$^3$ or less. The upper limit of the Mg concentration of the first p-type contact layer 71 is preferably $5.0 \times 10^{21}$ atoms/cm$^3$. The first p-type contact layer 71 is co-doped with Si usually used as a n-type dopant in addition to Mg that is a p-type dopant, which allows the light output power to be maintained high, thereby obtaining a III-nitride semiconductor light-emitting device with improved reliability. The inventor recognizes that the operation and effect of co-doping the first p-type contact layer with Mg and Si are as follows.

The inventor speculated that since Mg introduced into the p-type III-nitride semiconductor layer by doping easily diffuses into a light emitting layer to cause defects due to Mg to be easily formed in the light emitting layer, the defects would reduce the reliability. On the other hand, the inventor speculated that Si usually used as an n-type dopant hardly diffuses into the light emitting layer, and yet the diffusion of Mg into the light emitting layer could be inhibited. In the p-type contact layer 70, in a region closer to the p-side electrode 80 (the second p-type contact layer 72 in this embodiment), the Mg concentration of the p-type contact layer 70 is made high. Accordingly, the inventor conceived of providing a first p-type contact layer co-doped with Mg and Si in a region of the p-type contact layer 70 in contact with the p-type electron blocking layer 60. The result of the diligent studies made by the inventor demonstrated that the aforementioned reliability improvement effect can be achieved by providing the first p-type contact layer 71 according to this embodiment.

In order to ensure the above operation and effect, the thickness of the first p-type contact layer 71 is preferably 1 nm or more and 30 nm or less. Further, the thickness of the second p-type contact layer 72 is preferably 30 nm or less. In this case, the thickness of the first p-type contact layer 71 is more preferably 5 nm or more and 15 nm or less. As described above, the first p-type contact layer 71 is co-doped with Mg and Si, since when the thickness of the first p-type contact layer 71 is excessively large, the resistance of the p-type contact layer 70 per se becomes too high to contribute to reduction in the resistance, and on the other hand, when the thickness is excessively small, the operation and effect of co-doping with Mg and Si would be insufficient. From this point of view, the Mg concentration is preferably higher than the Si concentration in the first p-type contact layer 71. When the Mg concentration is lower than the Si concentration, the first p-type contact layer 71 would not serve as a p-type layer.

On the p-type contact layer 70, the p-side electrode 80 is provided in contact with the second p-type contact layer 72. The p-side electrode 80 can have a typical structure, and can be, for example, a metal composite film having a Ni-containing film and an Au-containing film formed on the Ni-containing film. The thickness, shape, and size of the p-side electrode 80 can be appropriately selected in accordance with the shape and size of the light-emitting device.

Thus, this embodiment can provide a III-nitride semiconductor light-emitting device with improved reliability capable of maintaining light output power reliably as compared with conventional devices, and a method of producing the III-nitride semiconductor light-emitting device.

Although not shown in FIG. 1, it is also preferable to provide a guide layer 50 between the light emitting layer 40 and the p-type electron blocking layer 60, the guide layer 50 being made of a III-nitride semiconductor layer having an Al composition higher than the Al composition x of the p-type electron blocking layer 60. The guide layer 50 is preferably made of AlGaN having an Al composition of 0.96 or more, and is most preferably constituted by an AlN layer formed such that the Al composition of a group III element is 1 (100%). Here, the thickness of the guide layer 50 can be, for example, 0.5 nm to 2.0 nm. Further, the guide layer 50 is preferably i-type (undoped); alternatively, a p-type dopant such as Mg or an n-type dopant such as Si may be added. The guide layer 50 is provided, so that the injection of holes into the light emitting layer 40 can be promoted.

Figure 2:
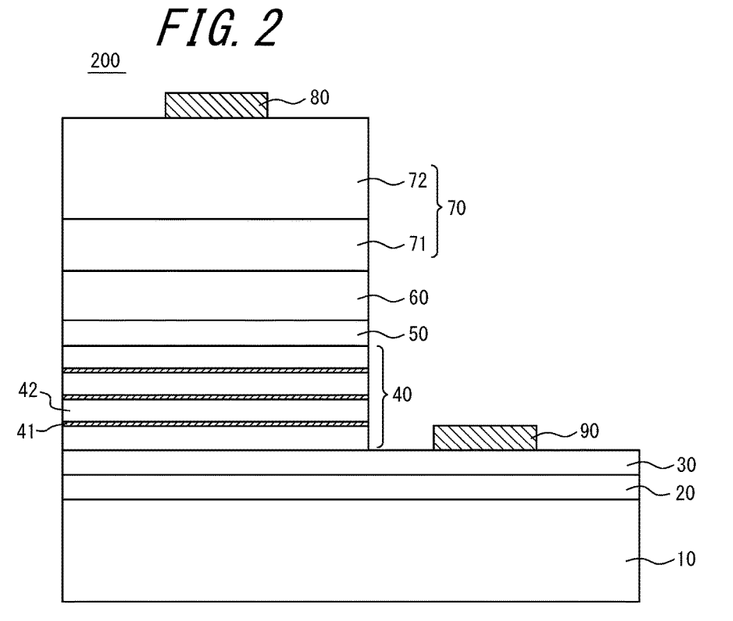
FIG. 2 is a schematic cross-sectional view illustrating a III-nitride semiconductor light-emitting device 200 according to a preferred aspect of a first embodiment.

Preferred aspects of this embodiment will be demonstrated below using a III-nitride semiconductor light-emitting device 200 having a so-called "lateral" structure illustrated in FIG. 2. The III-nitride semiconductor light-emitting device 200 depicted in FIG. 2 has a substrate 10, a buffer layer 20 on the substrate 10, and an n-type semiconductor layer 30 on the buffer layer 20, and the III-nitride semiconductor light-emitting device 100 described above is provided on the n-type semiconductor layer 30. In FIG. 2, the guide layer 50 is provided between the light emitting layer 40 and the p-type electron blocking layer 60. Further, in the III-nitride semiconductor light-emitting device 200 depicted in FIG. 2, the light emitting layer 40, the guide layer 50, the p-type electron blocking layer 60, and the p-type contact layer 70 are partly removed by for example etching, and an n-side electrode 90 is provided on the exposed part of the n-type semiconductor layer 30.

For example, a sapphire substrate can be used as the substrate 10. It is also preferable that a buffer layer 20 made of AlGaN is provided on a surface of the substrate 10 or that the buffer layer 20 is an AlN layer. Further, an AlN template substrate in which an AlN layer is provided as the buffer layer 20 epitaxially grown on a surface of a sapphire substrate may be used. Alternatively, an AlN single crystal substrate or an AlGaN single crystal substrate can be used. When a sapphire substrate is used, the substrate may optionally have an off-angle. When an off-angle θ is provided, the crystallographic orientation in the inclination direction may be either in the m axis direction or in the a axis direction. For example, a main surface of the sapphire substrate may be the C plane inclined at an off-angle of 0.5°. Naturally, the main surface of the sapphire substrate according to this embodiment is not limited to the C plane, and other planes such as the R plane, the A plane, or the M plane can be used. The thickness of the sapphire substrate can be appropriately selected from 300 μm to 1000 μm. For example, the thickness can be 430 μm. When the AlN template substrate is used, the crystallinity of the AlN layer on the surface of the sapphire substrate is preferably excellent. Further, a surface of the AlN template substrate is preferably provided with an undoped AlGaN layer. Note that regarding the state of the underside of the sapphire substrate, the substrate may be either a single-side polished substrate or a double-side polished substrate. Further, the underside of the sapphire substrate may be provided with photonic crystals or subjected to surface roughening to improve light extraction efficiency. The formation of photonic crystals and surface roughening are not necessarily performed before the formation of the AlN template substrate, and can be performed as appropriate in steps after forming the AlN template substrate, after forming the light-emitting device layer, and after chip assembly. Further, the photonic crystal formation and surface roughening can be performed by wet etching using a chemical solution, or dry etching using a gas; alternatively, both wet etching and dry etching can be used.

The n-type semiconductor layer 30 is provided on the buffer layer 20, and the n-type semiconductor layer 30 can be, for example, an n-type layer made of AlGaN, for which a typical n-type semiconductor layer can be used. The n-type semiconductor layer 30 is doped with an n-type dopant. Examples of the n-type dopant include Si, Ge, Sn, S, O, Ti, and Zr. The dopant concentration is not limited as long as the n-type semiconductor layer 30 can serve as an n-type layer; for example, the dopant concentration can be $1.0 \times 10^{18}$ atoms/cm$^3$ to $1.0 \times 10^{20}$ atoms/cm$^3$. Further, the Al composition of the n-type semiconductor layer 30 is not limited in particular and may be within a typical range. The n-type semiconductor layer 30 may be constituted by a single layer or a plurality of layers.

The n-side electrode 90 provided on the n-type semiconductor layer 30 can be formed, for example, as a metal composite film having a Ti-containing film and an Al-containing film formed on the Ti-containing film. The thickness, shape, and size of each of these films of the n-side electrode can be appropriately selected in accordance with the shape and the size of the light-emitting device.

The above-described III-nitride semiconductor light-emitting device 200 having a lateral structure is merely a specific aspect of the III-nitride semiconductor light-emitting device 100 according to this embodiment, and can be variously changed. For example, the III-nitride semiconductor light-emitting device 100 can of course be applied to a III-nitride semiconductor light-emitting device having a vertical structure.

(Second Embodiment: Method of Producing III-nitride Semiconductor Light-emitting Device)

Figure 3:
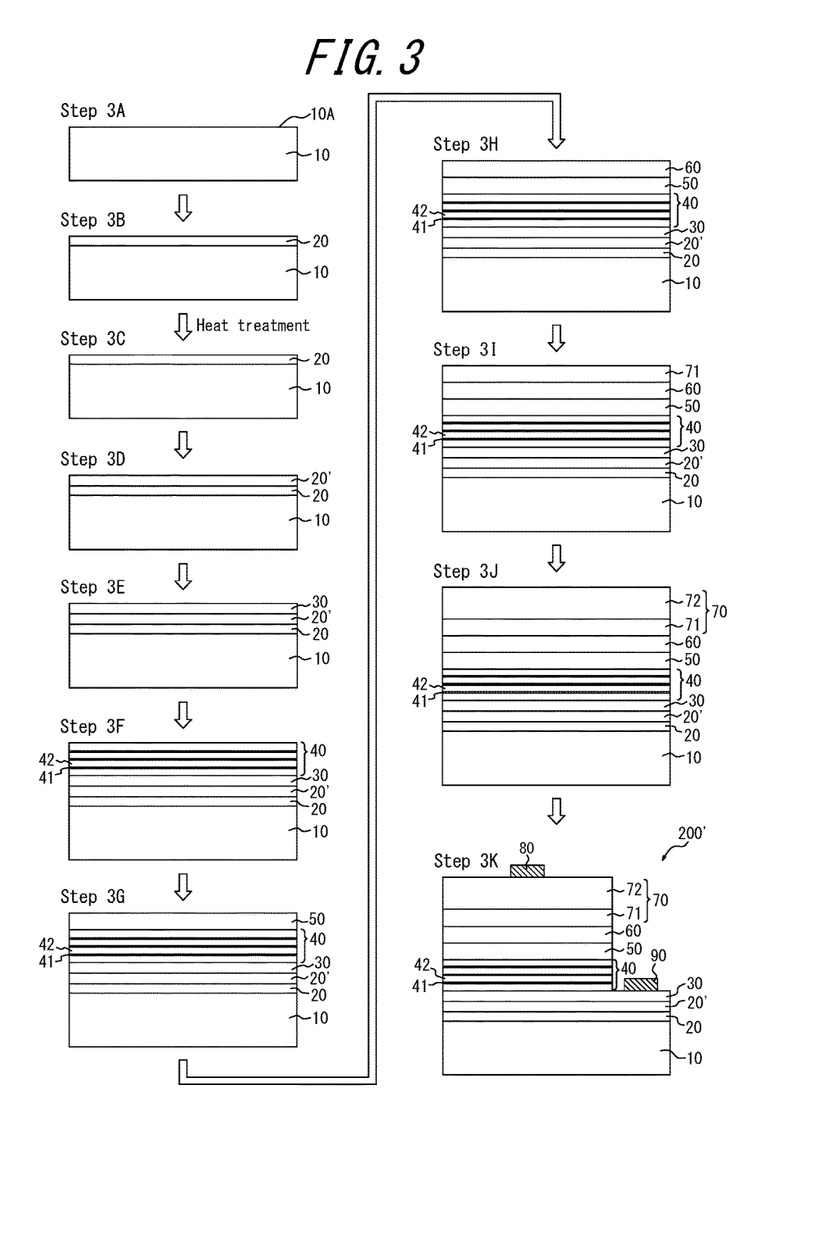
FIG. 3 is schematic cross-sectional view illustrating a method of producing a III-nitride semiconductor light-emitting device 200' according to a second embodiment.

As illustrated in FIG. 3, the method of producing a III-nitride semiconductor light-emitting device 200' according to the second embodiment includes a light emitting layer formation step of forming the light emitting layer 40 (Step 3F); an electron blocking layer formation step of forming the p-type electron blocking layer 60 on the light emitting layer 40 (Step 3H); a p-type contact layer formation step of forming the p-type contact layer 70 on the p-type electron blocking layer 60 (Step 3J). The p-type electron blocking layer 60 is made of a p-type III-nitride semiconductor having an Al composition of 0.5 or more, and the p-type contact layer 70 is made of a p-type III-nitride semiconductor having an Al composition of less than 0.4.

Here, it is a characteristic feature of this embodiment that the p-type contact layer formation step includes a first p-type contact layer formation step of forming the first p-type contact layer 71 co-doped with Mg and Si directly on the p-type electron blocking layer 60 (Step 3I, FIG. 3) and a second p-type contact layer formation step of forming the second p-type contact layer 72 doped with Mg on the first p-type contact layer 71 (Step 3J), and in the first p-type contact layer formation step, the Mg concentration of the first p-type contact layer 71 is $1 \times 10^{19}$ atoms/cm$^3$, and the Si concentration thereof is $2 \times 10^{18}$ atoms/cm$^3$ or more and $3 \times 10^{19}$ atoms/cm$^3$ or less. With reference to FIG. 3 illustrating process steps according to a preferred embodiment of the disclosed embodiments, specific aspects and the details of the steps will be described below in turn. This embodiment is somewhat similar to the foregoing embodiment, and description of the corresponding part will be omitted.

First, a sapphire substrate is preferably prepared as the substrate 10. An AlN template substrate in which an AlN layer is formed on a surface 10A of the substrate 10 is preferably formed, and a commercially available AlN template substrate may be used (see Step 3A and Step 3B in FIG. 3). The buffer layer 20 can be formed by a known thin film deposition technique, for example, by metalorganic chemical vapor deposition (MOCVD), molecular beam epitaxy (MBE), or sputtering.

For the Al source for the buffer layer 20, trimethylaluminum (TMA) can be used. Meanwhile, for the N source, ammonia (NH$_3$) gas can be used. Those source gases can be used to form the buffer layer 20 using hydrogen gas as a carrier gas.

Note that the growth temperature of the buffer layer 20 is preferably 1270° C. or more and 1350° C. or less, more preferably 1290° C. or more and 1330° C. or less. With this temperature range, the crystallinity of the buffer layer 20 can be improved when heat treatment is performed after that.

Further, the growth pressure in the chamber can be, for example, 5 Torr to 20 Torr. More preferably, the growth pressure is 8 Torr to 15 Torr.

The molar ratio of a group V element gas such as $NH_3$ gas to a group III element gas such as TMA gas, calculated based on the growth gas flow rate of the group V element gas and the group III element gas (hereinafter referred to as V/III ratio) can be, for example, 130 or more and 190 or less. More preferably, the V/III ratio is 140 or more and 180 or less. Note that since the growth temperature and the growth pressure determine the optimum V/III ratio, the growth gas flow rate is preferably determined appropriately.

Subsequently, the buffer layer 20 on the substrate 10 made of sapphire, obtained as described above is preferably subjected to a heat treatment at a temperature higher than the growth temperature of the buffer layer 20. The heat treatment is preferably performed at a temperature of 1500° C. to 1700° C. The heat treatment process can be performed using a known heat treatment furnace. Performing the heat treatment makes the half width of the X-ray rocking curve of the (10-12) plane of the buffer layer 20 made of AlN be 400 s or less; thus, high crystallinity can be achieved (Step 3C in FIG. 3).

After that, as illustrated as Step 3D in FIG. 3, an undoped AlGaN layer 20' is preferably formed on the buffer layer 20. A layer made of AlGaN can be formed using TMA as an Al source, trimethylgallium (TMG) as a Ga source, and $NH_3$ gas as an N source. This also applies to an n-type semiconductor layer, a light emitting layer, a guide layer, a p-type electron blocking layer, and a p-type semiconductor layer to be described. These source gases may be supplied into a chamber using hydrogen gas or nitrogen gas or a mixed gas of hydrogen and nitrogen as a carrier gas. Hydrogen gas is typically used as the carrier gas. The V/III ratio can be, for example, 100 or more and 100000 or less. More preferably, the V/III ratio is 300 or more and 30000 or less. Since the growth temperature and the growth pressure determine the optimum V/III ratio, the growth gas flow rate is preferably determined appropriately as with the case of forming the buffer layer 20.

Next, an n-type semiconductor layer formation step of forming the n-type semiconductor layer 30 can be performed (Step 3E in FIG. 3). The n-type semiconductor layer 30 can be formed on the buffer layer 20, preferably on the undoped AlGaN layer 20'. For an n-type dopant, for example, monosilane ($SiH_4$) gas can be used as a Si source.

Subsequently, as illustrated as Step 3F in FIG. 3, the light emitting layer formation step of forming the light emitting layer 40 is performed. When the light emitting layer 40 has a MQW structure, the ratio between the flow rate of the Al source and the flow rate of the Ga source is suitably changed, thereby forming the light emitting layer 40 having a MQW structure. When the light emitting layer 40 is formed from $Al_aGa_{1-a}N$ (0<a≤1), the growth temperature of $Al_aGa_{1-a}N$ is preferably 1000° C. or more and 1400° C. or less, more preferably 1050° C. or more and 1350° C. or less.

Next, as illustrated as Step 3G in FIG. 3, the guide layer 50 is preferably formed on the light emitting layer 40. For example, a source gas composed of trimethylaluminum gas (TMA gas) and ammonia gas ($NH_3$ gas) can be used to epitaxially grow the guide layer 50 made of AlN. In order to intentionally avoid the inclusion of other group III elements such as Ga, the source gas is particularly preferably composed of only trimethylaluminum gas (TMA gas) and ammonia gas ($NH_3$ gas). For its carrier gas, a carrier gas containing hydrogen or nitrogen as a main component can be used. The growth temperature is preferably 1000° C. or more and 1400° C. or less, more preferably 1050° C. or more and 1350° C. or less. The growth time can be selected appropriately, thereby controlling the thickness of the guide layer 50.

The term "carrier gas containing nitrogen as a main component" herein means a carrier gas in which the ratio of the volume of nitrogen to the total volume of the carrier gas is 60% or more. When "a carrier gas containing nitrogen as a main component" is used, the volume ratio of nitrogen is more preferably 85% or more, and most preferably nitrogen gas is used as the carrier gas. Note that "using nitrogen gas as a carrier gas" means to use a gas containing nitrogen at a volume ratio of substantially 100% as a carrier gas, yet the gas may contain inevitable impurity gas having a volume ratio of less than 0.01%. Further, the term "carrier gas containing hydrogen as a main component" means a carrier gas in which the ratio of the volume of hydrogen to the total volume of the carrier gas is 60% or more. More preferably, the volume ratio of hydrogen is 85% or more, and hydrogen gas is most preferably used as the carrier gas. Note that "using hydrogen gas as a carrier gas" means to use a gas containing hydrogen at a volume ratio of substantially 100% as a carrier gas, yet the gas may contain inevitable impurity gas having a volume ratio of less than 0.01%. Note that the volume ratio of the carrier gas here is tailored for gases supplied into the chamber and flown through a space adjacent to a wafer, and not for gases which are mainly used to purge a heater or the inner wall of the chamber and are exhausted without being flown through a space adjacent to the wafer. Specifically, even when a large amount of hydrogen is flown into a heater or to the inner wall of a chamber and then exhausted, if nitrogen is substantially flown to the vicinity of the wafer, the carrier gas contains nitrogen as a main component. This also applies to a carrier gas containing hydrogen as a main component.

Next, as illustrated as Step 3H in FIG. 3, the electron blocking layer formation step of forming the p-type electron blocking layer 60 is performed. When the p-type electron blocking layer 60 is formed from $Al_xGa_{1-x}N$ (b<x≤1), a gas containing hydrogen as a main component can be used as a carrier gas, and hydrogen gas is preferably used as the carrier gas. The source gases are TMA, TMG, and $NH_3$ gas as described above. For gases of the dopant sources used in combination with the source gases, for example, $CP_2Mg$ can be used as a Mg source and $ZnCl_2$ can be used as a Zn source.

The growth temperature of the p-type electron blocking layer 60 is preferably 1000° C. or more and 1400° C. or less, more preferably 1050° C. or more and 1350° C. or less. The growth pressure in the chamber can be, for example, 10 Torr to 760 Torr. More preferably, the growth pressure can be 20 Torr to 380 Torr.

Next as illustrated as Step 3I in FIG. 3, the first p-type contact layer 71 is directly formed on the p-type electron blocking layer 60, and as illustrated as Step 3J in FIG. 3, the second p-type contact layer 72 is then formed on the first p-type contact layer 71 thereby forming the p-type contact layer 70. In this embodiment, for a dopant for imparting p-type conductivity to the p-type contact layer 70, Mg is used in forming both the first p-type contact layer 71 and the second p-type contact layer 72. The first p-type contact layer 71 is formed by co-doping with Mg and Si using a Si source in addition to a Mg source. In co-doping, a mixed gas composed of monosilane ($SiH_4$) etc. for a Si source an bis(cyclopentadienyl)magnesium ($CP_2Mg$) etc. for the Mg source can be supplied to the chamber. After forming the first p-type contact layer 71, the supply of the Si source is stopped prior to the start of the formation of the second p-type contact layer 72.

The growth temperature of the p-type contact layer 70 is preferably 800° C. or more and 1400° C. or less, more preferably 900° C. or more and 1300° C. or less. The growth pressure in the chamber can be, for example, 10 Torr to 760 Torr. More preferably, the growth pressure can be 20 Torr to 600 Torr. For the carrier gas, hydrogen gas or nitrogen gas or a mixed gas of hydrogen and nitrogen can be used.

Here, in the first p-type contact layer formation step, a carrier gas containing nitrogen as a main component is preferably supplied, and more preferably, nitrogen gas is used as a carrier gas. Specifically, in this embodiment, preferably, the p-type electron blocking layer formation step in which a carrier gas containing hydrogen as a main component is supplied is followed by a step of changing the main component of the carrier gas from hydrogen to nitrogen, and after that, the first p-type contact layer formation step in which the carrier gas containing nitrogen as a main component is supplied is performed. When the first p-type contact layer 71 is formed by doping with Mg and Si both at high concentrations, a carrier gas containing nitrogen as a main component is used, which results in the activation of Mg, thereby maintaining the function of a p-type layer, and achieving the effect of high concentration Si doping in reducing the diffusive movement of Mg. Further, in performing the second p-type contact layer formation step, the supply of the carrier gas is switched from the carrier gas containing nitrogen as a main component to a carrier gas containing hydrogen as a main component, thereby forming the second p-type contact layer 72 using the carrier gas containing hydrogen as a main component. Preferably, after stopping the supply of the dopant gas of the Si source used in the first p-type contact layer formation step, a carrier gas containing nitrogen as a main component is first supplied to grow part of the second p-type contact layer 72, followed by switching the supply from the carrier gas containing nitrogen as a main component to a carrier gas containing hydrogen as a main component thereby growing the rest of the second p-type contact layer 72. This ensures that the reliability of the III-nitride semiconductor light-emitting device 200' can be enhanced. When the supply of the carrier gas is switched during the growth of the second p-type contact layer 72, the growth of the second p-type contact layer 72 is preferably stopped temporarily.

An example of such a technique for switching carrier gases will be described. First, the growth of the second p-type contact layer 72 is started using a carrier gas containing nitrogen as a main component. Next, upon once switching the flow of a metalorganic gas (a group III element gas and a dopant source gas) from into a chamber to a vent, the carrier gas flown into the chamber is switched from nitrogen to hydrogen, followed by the resumption of the supply of the metalorganic gas into the chamber, thereby forming the second p-type contact layer 72. Switching the supply of the carrier gas without switching the flow to the vent would cause abnormal growth due to a rapid change of the gas flow. Note that the group V element gas is preferably kept being flown into the chamber.

Lastly, as illustrated as Step 3K in FIG. 3, the light emitting layer 40, the guide layer 50, the p-type electron blocking layer 60, and the p-type contact layer 70 are partly removed by for example etching. The n-side electrode 90 is formed on the exposed part of the n-type semiconductor layer 30, and the p-side electrode 80 is formed on the surface of the second p-type contact layer 72. Thus, the III-nitride semiconductor light-emitting device 200' in accordance with a preferred embodiment can be fabricated. Examples of the materials of the electrodes provided in direct contact with the p-type and n-type contact layers include Ni and Rh for the p-side, and Ti and Mo for the n-side. The n-side electrode 90 may be formed after the formation of the p-side electrode 80; alternatively, the n-side electrode 90 may be formed before the formation of the p-side electrode 80. Further, parts of the respective electrode structures of the p-side electrode 80 and the n-side electrode 90 may be formed at the same time.

In this embodiment, for the same reason as in the first embodiment, it is preferable that the thickness of the first p-type contact layer 71 is 1 nm or more and 30 nm or less in the first p-type contact layer formation step, and the thickness of the second p-type contact layer 72 is 30 nm or more in the second p-type contact layer formation step. In this case, the thickness of the first p-type contact layer is more preferably 5 nm or more and 15 nm or less. In the first p-type contact layer formation step, the Mg concentration of the first p-type contact layer 71 is preferably higher than the Si concentration thereof.

Note that before forming the above-described n-side electrode 90, in order to reduce contact resistance between the n-type semiconductor layer 30 and the n-side electrode 90, a partial n-type GaN layer may be additionally formed by epitaxially growing an n-type GaN layer in an area to be provided with the n-side electrode 90 on the exposed part of the n-type semiconductor layer 30. Specifically, a $SiO_2$ film is preferably formed as a mask using MOCVD in the area other than the area to be provided with the n-side electrode 90. The additional n-type GaN layer can have a thickness of for example approximately 50 nm. For the n-type GaN layer, a mixed gas composed of TMG, ammonia, and $SiH_4$ gas can be supplied to the chamber to form a GaN layer doped with Si. After the formation of the n-type GaN layer, the $SiO_2$ film serving as a mask is preferably once removed without being used as a protective film to be described.

In the area of the exposed surface of the III-nitride semiconductor light-emitting device other than the area where current is flown, a protective film made of $SiO_2$ or $SiN_x$, or a protective film having a layered structure of $SiO_2$ and $SiN_x$ is preferably formed to a thickness of 50 nm to 500 nm by plasma CVD. Further, a reflective film can be formed on the protective film to improve the light extraction efficiency. For such a reflective film, a reflective film made of a metal or an alloy of Rh, Ag, Al, etc. having high reflectivity in the deep-ultraviolet region can be given as an example.

Further, a method to be described allows the substrate on which the epitaxial layers of the above-described III-nitride semiconductor light-emitting devices are formed to be cut into singulated chips, and light-emitting devices can be fabricated from the chips. Note that the size of each chip can be set appropriately to from 200 μm to 2000 μm on each side depending on the application; for example, the chip may have a square shape with a size of 1000 μm on each side. When high output power is required, in order to lower the current density, the chip size is typically increased. The shape of the chip is not limited to a square, and the shape can be selected from a variety of shapes including an oblong, a rhombus, a parallelogram, and a triangle. The directions of cutting for chip singulation are usually along the m plane and the a plane of sapphire; alternatively, directions inclined from the aforementioned planes may be employed to minimize damage due to the cutting. The directions may be inclined from the m plane and the a plane for example by an angle of 15°, 10°, 7.5°, or 5°.

In cutting into the chips, the stealth dicing technique is preferably used. The levels for laser irradiation for adjusting the depth position of the focal point can be for example four levels, and the number of the levels for laser irradiation can be adjusted in accordance with the thickness of the object to be cut. For the direction of incidence, the laser may be incident on a surface where epitaxial growth is not performed (hereinafter referred to as "sapphire surface side") or may be incident on the surface on which epitaxial growth has been performed, and the laser may be incident on both the epitaxially grown surface side and the sapphire surface side. When surface roughening for improving the light extraction efficiency is performed on the sapphire surface side, the laser is preferably incident on the epitaxially grown surface side.

The thickness of the chip is determined by the sum of the substrate thickness and the thickness of the semiconductor layers when full-cutting the sapphire substrate by the stealth dicing technique (the sapphire substrate is not ground and polished, so that its thickness can be maintained). As a matter of course, the thickness of the substrate may be controlled to a small thickness by grinding and polishing the sapphire substrate, before the singulation. The thickness of the sapphire substrate may be for example, 100 µm, 200 µm, or 300 µm. In contrast to controlling the thickness of the substrate to a small thickness, in order to improve the light extraction efficiency, the sapphire substrate used may have a thickness larger than a thickness of 430 µm usually used for a sapphire substrate, in such a case, the sapphire substrate can have a thickness of for example 600 µm, 800 µm, or 1000 µm. When the thickness of the sapphire substrate is as small as 200 µm or less, singulation can be performed by diamond scribing.

Further, the chips obtained by singulating the devices can each be assembled into a package. Although depending on the size of the chip, for example, a square chip having a side length of 1000 µm can be assembled into a flip chip package using a ceramic package having a 3.5 mm square shape with the use of Au bumps. Instead of Au bumps, a eutectic solder of Au—Sn can be used for bumps. A ceramic material of the ceramic package is appropriately selected considering the heat dissipation, and examples include AlN, alumina, SiN, Al, and Cu. A reflective metal film may be formed to inhibit absorption of light at the walls of the package. A reflective film material of the reflective metal film is selected appropriately taking into account the reflectivity of the light-emitting device with respect to the emission wavelength. Aside from ceramic packages, each chip obtained by singulating the devices can be mounted on a submount or a printed circuit board (PCB). Note that in order to ensure ESD tolerance, Zener diodes may be connected in parallel to be packaged.

For a light extraction portion of the package, quartz transparent to deep-ultraviolet light can be used as a window member. Examples of other materials that can be used for the window member include quartz crystal, sapphire, and $CaF_2$, and various glass materials can be selected depending on the transmittivity with respect to the emission wavelength range. Further, in order to improve the transmittance of ultraviolet light, an anti-reflection (AR) coating film of photonic crystals may be formed on the surface of the window member. The package and the window member can be bonded using a metal-based solder such as Au—Sn or a resin-based adhesive.

EXAMPLES

Experimental Example 1

Example 1

The disclosed method of producing a III-nitride semiconductor light-emitting device will be described in more detail below using examples. However, this disclosure is not limited to the following examples. A III-nitride semiconductor light-emitting device was fabricated in accordance with the process steps illustrated as Steps 3A to 3K in FIG. 3. First, a sapphire substrate (diameter: 2 in, thickness: 430 µm, lattice plane: (0001), off-angle θ in m-axis direction: 0.5°, terrace width: 100 nm, step height: 0.20 nm) was prepared (Step 3A). Next, an AlN layer having a center thickness of 0.60 µm (average thickness: 0.61 µm) was grown by MOCVD on the above sapphire substrate to obtain an AlN template substrate (Step 3B). On that occasion, the growth temperature of the AlN layer was 1300° C., the growth pressure in the chamber was 10 Torr, and the growth gas flow rate of ammonia gas and TMA gas was set so that the V/III ratio was 163. The flow rate of the group V element gas ($NH_3$) was 200 sccm, and the flow rate of the group III element gas (TMA) was 53 sccm. For the thickness of the AlN layer, the thicknesses of total 25 portions distributed at regular intervals, including the center of the wafer plane were measured using an interference thickness measurement system (Nanospec M6100A manufactured by Nanometrics Incorporated).

Next, the above AlN template substrate was introduced into a heat treatment furnace. After the pressure of the furnace was reduced to 10 Pa, the furnace was purged with nitrogen gas to achieve a nitrogen gas atmosphere in the furnace, followed by raising the temperature inside the furnace, thus performing heat treatment on the AlN template substrate (Step 3C). The heat treatment was performed at a heating temperature of 1650° C. for a heating time of four hours.

Subsequently, as an undoped AlGaN layer, an undoped $Al_{0.7}Ga_{0.3}N$ layer made of $Al_{0.7}Ga_{0.3}N$ having a thickness of 1 µm was formed by MOCVD (Step 3D). Next, as a n-type semiconductor layer, an n-type $Al_{0.65}Ga_{0.35}N$ layer with a thickness of 2 µm made of $Al_{0.65}Ga_{0.35}N$ doped with Si was formed on the above AlGaN layer (Step 3E). Note that according to a result of SIMS analysis, the Si concentration of the n-type semiconductor layer was $1.0 \times 10^{19}$ atoms/$cm^3$.

Next, on the n-type semiconductor layer, well layers made of $Al_{0.45}Ga_{0.55}N$ with a thickness of 3 nm and barrier layers made of $Al_{0.65}Ga_{0.35}N$ with a thickness of 7 nm were alternately and repeatedly stacked thereby forming a light emitting layer having 3.5 pairs of the layers (Step 3F). Of the 3.5 pairs, 0.5 pair indicates that the top and bottom layers in the light emitting layer were barrier layers.

After that, on the light emitting layer, an i-type AlN guide layer having a thickness of 1 nm was formed (Step 3G). Next, a p-type electron blocking layer made of $Al_{0.68}Ga_{0.32}N$ with a thickness of 40 nm was formed using hydrogen gas as a carrier gas (Step 3H). In forming the p-type electron blocking layer, Mg doping was performed by supplying $CP_2Mg$ gas as a Mg source into the chamber. According to a result of SIMS analysis, the Mg concentration of the p-type electron blocking layer was $5.0 \times 10^{18}$ atoms/$cm^3$.

Subsequently, a p-type contact layer made of GaN with a total thickness of 180 nm was formed (Step 3I, Step 3J). For the formation of the p-type contact layer, first, the first 30 nm (thickness range of 0 nm to 30 nm when the position of the surface of the p-type electron blocking layer corresponds to a thickness of 0 nm) was formed by supplying a mixed gas composed of CP$_2$Mg gas and SiH$_4$ gas into the chamber, thereby forming a first p-type contact layer co-doped with Mg and Si. After that, the supply of the SiH$_4$ gas was stopped and a second p-type contact layer corresponding to the remaining 150 nm (thickness range of 30 nm to 180 nm) was formed successively. Here, for the carrier gases used in forming the p-type contact layer, first, nitrogen gas was used as a carrier gas to grow the first p-type contact layer corresponding to the first 30 nm thick part (thickness range of 0 nm to 30 nm), and after the growth of the first p-type contact layer, the carrier gas was switched to hydrogen gas to grow the second p-type contact layer corresponding to the remaining 150 nm thick part (thickness range of 30 nm to 180 nm). Note that in the stage where the last 30 nm thick part of the second p-type contact layer (part to be in contact with a p-side electrode, thickness range of 150 nm to 180 nm), the flow rate of TMG gas was reduced to increase the probability of the presence of Mg and the growth rate was reduced, thereby obtaining a layer having a high Mg concentration. As a result of SIMS analysis, the 150 nm thick part of the p-type contact layer on the p-type electron blocking layer side (including the first p-type contact layer, thickness range of 0 nm to 150 nm) had a Mg concentration of $3.0 \times 10^{19}$ atoms/cm$^3$, and the remaining 30 nm thick part intended to have a high Mg concentration (thickness range of 150 nm to 180 nm) had a Mg concentration of $1.2 \times 10^{20}$ atom/cm$^3$. In the thickness rage of 0 nm to 30 nm corresponding to the first p-type contact layer, the Si concentration was $2.0 \times 10^{19}$ atoms/cm$^3$.

After that, a mask was formed on the p-type contact layer, and mesa etching was performed by dry etching to expose the n-type semiconductor layer. A p-side electrode made of Ni/Au was then formed on the p-type contact layer, and an n-side electrode made of Ti/Al was formed on the exposed n-type semiconductor layer. The p-side electrode had Ni having a thickness of 50 angstrom and Au having a thickness of 1500 angstrom. The n-side electrode had Ti having a thickness of 200 angstrom and Al having a thickness of 1500 angstrom. Lastly, contact annealing (RTA: Rapid Thermal Annealing) was performed at 550° C., thereby forming both the electrodes (Step 3K). Thus, a III-nitride semiconductor light-emitting device of Example 1 was fabricated. The layer structure of Example 1 is presented in Table 1. Note that on the area of the exposed surface of the III-nitride semiconductor light-emitting device other than the area where current is flown, a protective film made of SiO$_2$ is formed to a thickness of 200 nm by plasma CVD. The chips had a square shape having a side length of 1000 μm. The cutting for chip singulation was performed in the directions along the m plane and the a plane of sapphire using the stealth dicing technique, and the thickness of the sapphire substrate was 430 μm (full-cut). For the direction of incidence, the laser used in stealth dicing was incident on the sapphire surface side, and four levels were employed for the laser irradiation.

TABLE I

| | Al composition | Dopant | Thickness |
|---|---|---|---|
| Second p-type contact layer | 0 | Mg | 150 nm |
| First p-type contact layer | 0 | Mg + Si | 30 nm |
| P-type electron blocking layer | 0.68 | Mg | 40 nm |
| I-type guide layer | 1 | — | 1 nm |

TABLE I-continued

| | Al composition | Dopant | Thickness |
|---|---|---|---|
| Light emitting layer | 0.65 | — | 7 nm |
| | 0.45 | — | 3 nm |
| | 0.65 | Si | 7 nm |
| | 0.45 | — | 3 nm |
| | 0.65 | Si | 7 nm |
| | 0.45 | — | 3 nm |
| | 0.65 | Si | 7 nm |
| N-type semiconductor layer | 0.65 | Si | 2 μm |
| Undoped layer | 0.70 | — | 1 μm |
| AlN layer | 1 | — | 0.6 μm |
| Sapphire substrate | — | — | 430 μm |

Example 2

A III-nitride semiconductor light-emitting device of Example 2 was fabricated in the same manner as in Example 1 except that the thickness of the first p-type contact layer was changed from 30 nm in Example 1 to 15 nm, and after growing the first p-type contact layer, the supply of SiH$_4$ gas was stopped, followed by the formation of the second p-type contact layer to 15 nm (that is, the thickness range of 15 nm to 30 nm) with the carrier gas being nitrogen gas without change; and the growth was temporarily stopped to switch the carrier gas from nitrogen gas to hydrogen gas, thereby growing the remaining second p-type contact layer.

Example 3

A III-nitride semiconductor light-emitting device of Example 3 was fabricated in the same manner as in Example 1 except that the thickness of the first p-type contact layer was changed from 30 nm in Example 1 to 5 nm, and after growing the first p-type contact layer, the supply of SiH$_4$ gas was stopped, followed by the formation of the second p-type contact layer to 25 nm (that is, the thickness range of 5 nm to 30 nm) with the carrier gas being nitrogen gas without change; the growth was temporarily stopped to switch the carrier gas from nitrogen gas to hydrogen gas, thereby growing the remaining second p-type contact layer; and the Si concentration of the first p-type contact layer was changed from $2.0 \times 10^{19}$ atoms/cm$^3$ in Example 1 to $1.0 \times 10^{19}$ atoms/cm$^3$.

Example 4

A III-nitride semiconductor light-emitting device of Example 4 was fabricated in the same manner as in Example 1 except that the Si concentration of the first p-type contact layer was changed from $2.0 \times 10^{19}$ atoms/cm$^3$ in Example 1 to $2.0 \times 10^{18}$ atoms/cm$^3$.

Comparative Example 1

A III-nitride semiconductor light-emitting device of Comparative Example 1 was fabricated in the same manner as in Example 1 except that in forming the p-type contact layer, only Mg doping was performed without performing doping with Si as in Example 1. Specifically, the thickness of the first p-type contact layer was 0 nm (no part was co-doped with Mg and Si), and the thickness of the second p-type contact layer was 180 nm in Comparative Example 1. Further, in the thickness range of 0 nm to 30 nm, nitrogen gas was used as a carrier gas, and in the thickness range of 30 nm to 180 nm, hydrogen gas was uses as a carrier gas.

Comparative Example 2

A III-nitride semiconductor light-emitting device of Comparative Example 2 was fabricated in the same manner as in Example 1 except that the Si concentration of the first p-type contact layer was changed from $2.0 \times 10^{19}$ atoms/cm$^3$ in Example 1 to $4.0 \times 10^{18}$ atoms/cm$^3$.

Comparative Example 3

A III-nitride semiconductor light-emitting device of Comparative Example 3 was fabricated in the same manner as in Example 1 except that the Si concentration of the first p-type contact layer was changed from $2.0 \times 10^{19}$ atoms/cm$^3$ in Example 1 to $8.0 \times 10^{18}$ atoms/cm$^3$.

The conditions for forming the p-type contact layers in Examples 1 to 4 and Comparative Examples 1 to 3 above are presented in Table 2.

Figure 4:
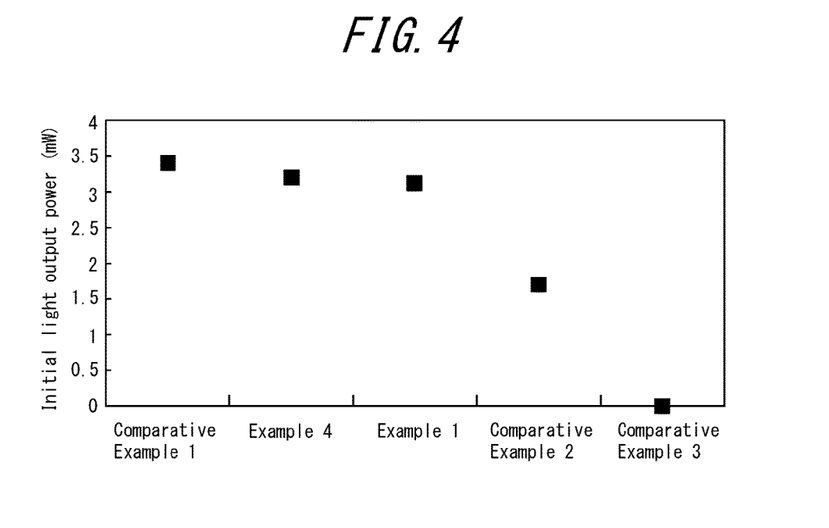
FIG. 4 is a graph illustrating the initial light output power in Examples and Comparative Examples.

Examples 1 to 3 and Comparative Example 1 are given in Table 3. Further, FIG. 4 shows the light output power Po in Examples 1 and 4 and Comparative Examples 1 to 3 when a current of 20 mA was flown. The light output power Po was 3.2 mW in Example 4. In Comparative Example 2, not all the samples emitted light, and even the samples that emitted light had a low output power of 1.7 mW at maximum. Moreover, none of the samples emitted light in Comparative Example 3. The center emission wavelength was measured using a fiber optic spectrometer in Examples 1 to 4 and Comparative Examples 1 to 3 and was in the range of 280 nm to 290 nm in each example.

Figure 5:
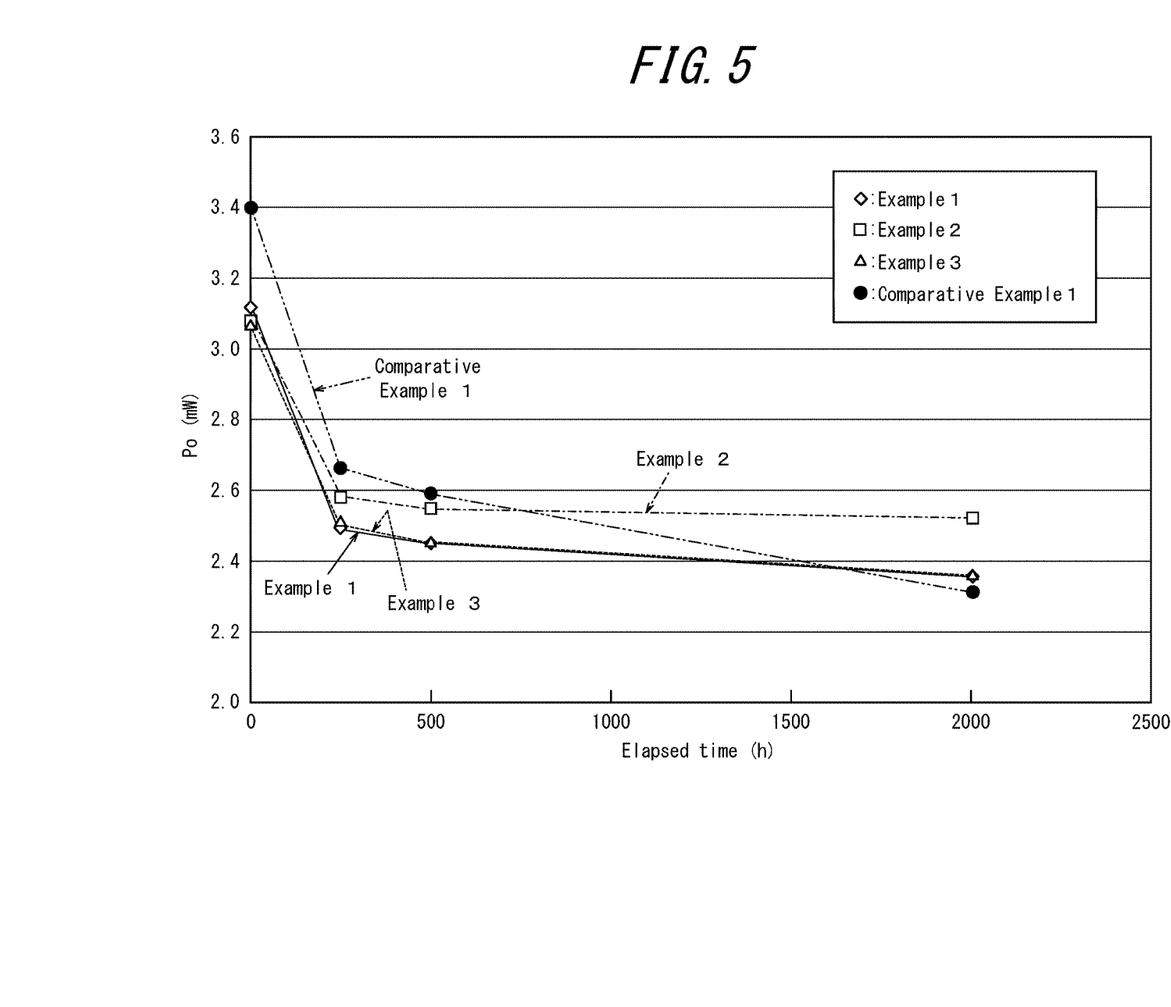
FIG. 5 is a graph illustrating the progression of the initial light output power over time in Examples and Comparative Examples.

Further, for the three samples for each of Examples 1 to 3 and Comparative Example 1, a current of 40 mA was supplied using a constant current constant voltage power supply, and the light output power was measured for the initial value, after 250 hours, after 500 hours, and after 2000 hours using an integrating sphere, and the average was calculated. The results are presented in FIG. 5. From those results, the remaining light output (light output power after

TABLE 2

| | Conditions for forming p-type contact layer | | | | | |
|---|---|---|---|---|---|---|
| | First p-type contact layer | | Second p-type contact layer | | | |
| | Carrier gas: Nitrogen gas | | Carrier gas: Nitrogen gas | | Carrier gas: Hydrogen gas | |
| | Dopant | Si concentration (atoms/cm$^3$) | Thickness range (nm) | Dopant | Thickness range (nm) | Dopant | Thickness range (nm) |
| Example 1 | Mg + Si | $2.0 \times 10^{19}$ | 0-30 | — | — | Mg | 30-180 |
| Example 2 | Mg + Si | $2.0 \times 10^{19}$ | 0-15 | Mg | 15-30 | Mg | 30-180 |
| Example 3 | Mg + Si | $1.0 \times 10^{19}$ | 0-5 | Mg | 5-30 | Mg | 30-180 |
| Example 4 | Mg + Si | $2.0 \times 10^{18}$ | 0-30 | — | — | Mg | 30-180 |
| Comparative Example 1 | — | — | — | Mg | 0-30 | Mg | 30-180 |
| Comparative Example 2 | Mg + Si | $4.0 \times 10^{19}$ | 0-30 | — | — | Mg | 30-180 |
| Comparative Example 3 | Mg + Si | $8.0 \times 10^{19}$ | 0-30 | — | — | Mg | 30-180 |

<Evaluation>

The forward voltage Vf at a 20 mA current supplied to each of the semiconductor light-emitting devices obtained in Examples 1 to 4 and Comparative Examples 1 to 3 by a constant current constant voltage power supply was measured and the light output power Po thereof was measured using an integrating sphere. The measurement was performed on three samples for each example, and the average of the measurement results was calculated. Results of a predetermined time/initial light output power) was calculated for Examples 1 to 3 and Comparative Example 1. The results are given in Table 3. For the samples of Example 4, a current of 40 mA was supplied and the initial light output power and the light output power after 250 hours were measured to calculate the remaining light output; thus, the remaining light output was found to be higher compared with that in Comparative Example 1.

TABLE 3

| | Evaluation | | | | | |
|---|---|---|---|---|---|---|
| | First p-type contact Layer | | Remaining light output | | | Initial light output | |
| | Thickness (nm) | Si concentration (atoms/cm$^3$) | After 250 hours | After 500 hours | After 2000 hours | power Po (mW) | Vf (V) |
| Example 1 | 30 | $2.0 \times 10^{19}$ | 80.0% | 78.8% | 75.6% | 3.12 | 6.61 |
| Example 2 | 15 | $2.0 \times 10^{19}$ | 83.9% | 82.8% | 81.9% | 3.08 | 5.69 |
| Example 3 | 5 | $1.0 \times 10^{19}$ | 82.1% | 80.2% | 77.2% | 3.07 | 5.29 |
| Comparative Example 1 | 0 | — | 78.3% | 76.2% | 68.1% | 3.40 | 5.82 |

The above evaluation results demonstrate that in each of Examples 1 to 4 in which the first p-type contact layer co-doped with Mg and Si was provided, the initial output was lower by only 10% or less compared with Comparative Example 1, and the remaining light output was improved, so that the holding time of the output according to an Arrhenius plot was significantly prolonged. Accordingly, it was confirmed that when the conditions specified in this disclosure are met, a III-nitride semiconductor light-emitting device with improved reliability capable of maintaining light output power reliably as compared with conventional device can be fabricated. In particular, the results of Examples 2 and 3 demonstrate that when the thickness of the first p-type contact layer is 5 nm to 15 nm, in addition to the improvement in reliability, the forward voltage can be significantly reduced. As demonstrated by Comparative Examples 2 and 3, when the Si concentration of the first p-type contact layer was too high, the device failed to serve as a light-emitting device.

INDUSTRIAL APPLICABILITY

This disclosure is useful because a III-nitride semiconductor light-emitting device with improved reliability capable of maintaining light output power reliably as compared with conventional devices, and a method of producing the III-nitride semiconductor light-emitting device can be provided.

The invention claimed is:

1. A III-nitride semiconductor light-emitting device comprising: a light emitting layer, a p-type electron blocking layer, a p-type contact layer, and a p-side electrode in this order,
wherein the p-type electron blocking layer is made of a p-type III-nitride semiconductor having an Al composition of 0.5 or more,
the p-type contact layer is made of a p-type III-nitride semiconductor having an Al composition of less than 0.4,
the p-type contact layer has a first p-type contact layer co-doped with Mg and Si in contact with the p-type electron blocking layer, and has a second p-type contact layer doped with Mg in contact with the p-side electrode, and
the first p-type contact layer has a Mg concentration of $1 \times 10^{19}$ atoms/cm$^3$ or more, and a Si concentration of $1.0 \times 10^{19}$ atoms/cm$^3$ or more and $3 \times 10^{19}$ atoms/cm$^3$ or less.

2. The III-nitride semiconductor light-emitting device according to claim 1, wherein a thickness of the first p-type contact layer is 1 nm or more and 30 nm or less, and a thickness of the second p-type contact layer is 30 nm or more.

3. The III-nitride semiconductor light-emitting device according to claim 2, wherein a thickness of the first p-type contact layer is 5 nm or more and 15 nm or less.

4. The III-nitride semiconductor light-emitting device according to claim 1, wherein in the first p-type contact layer, the Mg concentration is higher than the Si concentration.

5. The III-nitride semiconductor light-emitting device according to claim 1, wherein a center wavelength of light emitted from the light emitting layer is 210 nm or more and 340 nm or less.

6. A method of producing a III-nitride semiconductor light-emitting device, comprising:

a light emitting layer formation step of forming a light emitting layer;
a p-type electron blocking layer formation step of forming a p-type electron blocking layer on the light emitting layer;
a p-type contact layer formation step of forming a p-type contact layer on the p-type electron blocking layer; and
a p-side electrode formation step of forming a p-side electrode directly on the p-type contact layer,
wherein the p-type electron blocking layer is made of a p-type III-nitride semiconductor having an Al composition of 0.5 or more,
the p-type contact layer is made of a p-type III-nitride semiconductor having an Al composition of less than 0.4,
the p-type contact layer formation step includes a first p-type contact layer formation step of forming a first p-type contact layer co-doped with Mg and Si directly on the p-type electron blocking layer, and a second p-type contact layer formation step of forming a second p-type contact layer doped with Mg on the first p-type contact layer, and
in the first p-type contact layer formation step, the first p-type contact layer has a Mg concentration of $1 \times 10^{19}$ atoms/cm$^3$ or more and a Si concentration of $1.0 \times 10^{19}$ atoms/cm$^3$ or more and $3 \times 10^{19}$ atoms/cm$^3$ or less.

7. The method of producing a III-nitride semiconductor light-emitting device, according to claim 6,
wherein in the first p-type contact layer formation step, a thickness of the first p-type contact layer is 1 nm or more and 30 nm or less, and
in the second p-type contact layer formation step, a thickness of the second p-type contact layer is 30 nm or more.

8. The method of producing a III-nitride semiconductor light-emitting device, according to claim 7, wherein a thickness of the first p-type contact layer is 5 nm or more and 15 nm or less.

9. The method of producing a III-nitride semiconductor light-emitting device, according to claim 6, wherein in the first p-type contact layer formation step, the Mg concentration is higher than the Si concentration.

10. The method of producing a III-nitride semiconductor light-emitting device, according to claim 6, wherein in the p-type electron blocking layer formation step, a carrier gas containing hydrogen as a main component is supplied, and
in the first p-type contact layer formation step, a carrier gas containing nitrogen as a main component is supplied.

11. The method of producing a III-nitride semiconductor light-emitting device, according to claim 6, wherein in the second p-type contact layer formation step, a carrier gas containing nitrogen as a main component is supplied first, and the supply is then switched from the carrier gas containing nitrogen as a main component to a carrier gas containing hydrogen as a main component.

12. The method of producing a III-nitride semiconductor light-emitting device, according to claim 6, wherein a center wavelength of light emitted from the light emitting layer is 210 nm or more and 340 nm or less.

13. The III-nitride semiconductor light-emitting device according to claim 1, wherein the first p-type contact layer has a Mg concentration of $3.0 \times 10^{19}$ atoms/cm$^3$ or less.

14. The III-nitride semiconductor light-emitting device according to claim 1, wherein the second p-type contact layer has a dopant consisting of Mg.

15. The method of producing a III-nitride semiconductor light-emitting device, according to claim 6, wherein the first p-type contact layer has a Mg concentration of $3.0 \times 10^{19}$ atoms/cm$^3$ or less.

16. The III-nitride semiconductor light-emitting device according to claim 6, wherein the second p-type contact layer has a dopant consisting of Mg.

* * * * *